(12) United States Patent
Fukao et al.

(10) Patent No.: US 8,470,403 B2
(45) Date of Patent: Jun. 25, 2013

(54) ORGANIC THIN FILM DEPOSITION DEVICE, ORGANIC EL ELEMENT MANUFACTURING DEVICE, AND ORGANIC THIN FILM DEPOSITION METHOD

(75) Inventors: Masato Fukao, Chigasaki (JP); Hiroshi Kikuchi, Chigasaki (JP); Yoshio Sunaga, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 13/475,228

(22) Filed: May 18, 2012

(65) Prior Publication Data

US 2012/0231166 A1    Sep. 13, 2012

Related U.S. Application Data

(60) Division of application No. 13/080,743, filed on Apr. 6, 2011, now Pat. No. 8,298,340, which is a continuation of application No. PCT/JP2009/069256, filed on Nov. 12, 2009.

(30) Foreign Application Priority Data

Nov. 14, 2008    (JP) ................................ 2008-292242

(51) Int. Cl.
    *C23C 16/445*    (2006.01)
    *C23C 16/04*    (2006.01)

(52) U.S. Cl.
    USPC ................... 427/255.5; 427/255.23; 414/936

(58) Field of Classification Search
    USPC ............................ 427/255.23, 255.5; 414/936
    See application file for complete search history.

(56) References Cited

U.S. PATENT DOCUMENTS

| 4,651,674 A * | 3/1987 | Hayashi et al. ............... 118/728 |
| 6,036,426 A | 3/2000 | Hillman ........................ 414/331 |
| 6,092,485 A | 7/2000 | Ando et al. ................... 118/723 |
| 6,251,191 B1 | 6/2001 | Matsuse ........................ 118/719 |
| 2003/0172874 A1 | 9/2003 | Kawaguchi ................... 118/728 |
| 2008/0145521 A1 | 6/2008 | Guo et al. ........................ 427/75 |

FOREIGN PATENT DOCUMENTS

| JP | 2004-241319 | 8/2004 |
| JP | 2005-120476 | 5/2005 |
| JP | 2008-56966 | 3/2008 |
| WO | WO 2005/093120 A1 | 10/2005 |

OTHER PUBLICATIONS

Internatioanl Search Report for International Application No. PCT/JP2009/069256 dated Jan. 22, 2010 with English translation.
PCT Notification of Trasnmittal of Translation of the International Preliminary Report on Patentability (PCT Chapter I).

* cited by examiner

*Primary Examiner* — Parviz Hassanzadeh
*Assistant Examiner* — Nathan K Ford
(74) *Attorney, Agent, or Firm* — Kratz, Quintos & Hanson, LLP

(57) ABSTRACT

An organic thin film deposition device that is compact and high in processing capability is provided. Inside a vacuum chamber, first and second substrate arrangement devices that can be in a horizontal posture and a standing posture are provided; and when in the standing posture, substrates held by the respective substrate arrangement devices and first and second organic vapor discharging devices face each other. When one of the substrate arrangement devices is in the horizontal posture, masks and the substrates are lifted up by alignment pins and transfer pins and are replaced with a substrate not yet film formed, for position adjustment. With one organic thin film deposition device, two substrates can be processed at the same time.

2 Claims, 7 Drawing Sheets

Prior art

ORGANIC THIN FILM DEPOSITION DEVICE, ORGANIC EL ELEMENT MANUFACTURING DEVICE, AND ORGANIC THIN FILM DEPOSITION METHOD

CROSS REFERENCE TO RELATED APPLICATIONS

This application resulted from a divisional application of U.S. patent application Ser. No. 13/080,743, filed Apr. 6, 2011, now U.S. Pat. No. 8,298,340, which is a continuation of International Application No.PCT/JP2009/69256, filed on Nov. 12, 2009, which claims priority to Japan Patent Application No.2008-292242, filed on Nov. 14, 2008. The contents of all of the above-mentioned prior applications are herein incorporated by reference in their entireties.

BACKGROUND OF THE INVENTION

1. Field of the Invention

The present invention relates to a technical field of organic EL display devices, and more particularly to an organic thin film deposition device that manufactures an organic thin film used for an organic EL element and an organic display device manufacturing device having the organic thin film deposition device.

2. Description of the Background Art

In devices for manufacturing organic EL elements, a cluster system and an in-line system are known.

FIG. 11(a) is a manufacturing device 200 of a cluster system. A substrate carried in from a carry-in chamber 201 is carried into deposition chambers 202 through 206, which are connected to a transport chamber 209, by a transport robot arranged in the transport chamber 209; and an organic thin film is formed sequentially in each of the deposition chambers 202 through 206, and is moved to a transport chamber 219 in a next stage, via a delivery chamber 207.

A substrate transport robot is also arranged in the transport chamber 219 in the next stage: the substrate is moved in order from deposition chambers 211 through 214, arranged on the circumference of the transport chamber 219; an organic thin film or a cathode electrode is formed in each of the deposition chambers 211 through 214; and the substrate is carried outside the manufacturing device 200 from a carry-out chamber 215.

Mask stock chambers 221 and 222 are connected to the respective transport chambers 209 and 219. In the deposition chambers 202 through 206 and 211 through 214, a mask is formed in alignment relative to the substrate and is used for film formation on a plurality of substrates, and a mask that has been used many times is replaced with a mask arranged in the mask stock chambers 221 and 222 to allow continuous processing of a large number of substrates.

FIG. 11(b) is a manufacturing device 300 of an in-line system.

Substrate transport robots are arranged inside a transport chamber 309 in a prior stage and a transport chamber 329 in a later stage, and a substrate carried from a carry-in chamber 301 is carried to a pre-process chamber 302 connected to the transport chamber 309 by the substrate transport robot in the transport chamber 309 in the prior stage.

In addition, a movement chamber 311 is connected to the transport chamber 309, and the substrate that has been pre-processed in the pre-process chamber 302 is moved to an alignment chamber 312 which is not connected to the transport chamber 309 via the movement chamber 311.

A mask is arranged in the alignment chamber 312, and after the substrate and the mask are aligned to attach the mask to the substrate, they are carried in an in-line deposition chamber 314 via a turnabout chamber 313.

In the in-line deposition chamber 314, while the substrate and the mask are moved, an organic thin film is formed on a substrate surface, and the substrate and the mask that have come out of the in-line deposition chamber 314 are carried into a separation chamber 316 via a turnabout chamber 315 to separate the mask from the substrate.

The separation chamber 316 is connected to a transport chamber 329 in a later stage, and the substrate separated in the separation chamber 316 is carried, via the transport chamber 329 in the later stage, in sputtering chambers 321 and 322 connected to the transport chamber 329.

In the sputtering chambers 321 and 322, a cathode electrode film is formed on the substrate, and it is taken out of the organic EL element manufacturing device 300 via a carry-out chamber 323.

The separated mask is collected in a collection chamber 332. A new mask is arranged in a supply chamber 331 and is supplied to the alignment chamber 312.

See, Japanese Patent Documents JP-A 2008-56966 and JP-A 2004-241319.

SUMMARY OF THE INVENTION

In the two types of organic EL element manufacturing devices 200 and 300 as discussed above, problems as described below arise in a case of handling a large-sized substrate or in a case of reducing the takt time.

(1) The mask is replaced by means of the substrate transport robot, and although the mask is enlarged as the substrate is enlarged, there is no substrate transport robot that can transport an enlarged mask. Even if such a robot can be developed, it has to be one that is too large.

(2) To make the takt time shorter, the number of film formation chambers is required to be increased, which can cause the device costs and the foot print to increase. In addition, alignment devices, vacuum chambers, and exhaust systems are required to be in a same number of the deposition devices, so that the costs becomes expensive and the devices become complex.

(3) In the case of an in-line device, when the number of vacuum chambers becomes large, so does the size of the device. Particularly in a case of manufacturing an organic EL element device, which arranges each light emission portions of red, green, and blue in discrete positions, the number of the in-line loops is for at least three, which causes the device to become even more large.

To solve the above problems, an embodiment of the present invention is directed to an organic thin film deposition device, having a vacuum chamber; first and second substrate arrangement devices arranged in the vacuum chamber, and in which first and second substrates are arranged; first and second masks respectively located on the first and second substrate arrangement devices, and having openings formed therein; a first rotating shaft for operating so as to switch the first substrate arrangement device together with the first mask into a horizontal posture to be horizontal at a vertically overlapping position, and to switch the first substrate arrangement device together with the first mask into a standing posture to be arranged in a standing manner; a second rotating shaft for operating to put the second substrate arrangement device together with the second mask into the horizontal posture to be horizontal at a vertically overlapping position, and to switch the second substrate arrangement device together with the second mask into the standing posture to be arranged in a standing manner; and first and second organic vapor discharging devices, provided in the vacuum chamber, and for discharging an organic material vapor from discharging openings provided in first and second organic vapor discharging planes, wherein the first and second substrates are configured to change their posture between the horizontal posture and the standing posture in a state of being sandwiched respectively by the first and second substrate arrangement devices and the first and second masks, due to operation of the first and second rotating shafts, and wherein the first and second organic vapor discharging planes are configured to face respectively the first and second masks which have switched into the standing posture, and to let the organic material vapor discharged from the discharging openings of the first and second organic vapor discharging planes pass through the openings of the first and second masks to reach film formation planes of the first and second substrates.

The present embodiment may also be directed to the organic thin film deposition device, wherein the standing posture is made by moving the first and second substrates rotationally at an angle of less than 90° from the horizontal posture, with surfaces on which the first and second masks are arranged facing upward.

The present embodiment may also be directed to the organic thin film deposition device, wherein a passage for flowing a cooling medium liquid is formed respectively in the first and second substrate arrangement devices.

The present embodiment may also be directed to the organic thin film deposition device, wherein vapor generation sources are respectively connected to the first and second organic vapor discharging devices; and wherein the organic material vapor generated by the vapor generation source is configured such that the vapor can be discharged from the discharging openings of the first and second organic vapor discharging planes.

The present embodiment may also be directed to the organic thin film deposition device, further having first and second absorbing magnets provided in the first and second substrate arrangement devices, for magnetically absorbing the first and second masks to the first and second substrate arrangement devices.

The present embodiment may also be directed to the organic thin film deposition device, further having a mask moving device for moving the respective first and second masks vertically on the first and second substrate arrangement devices in the horizontal posture.

The present embodiment may also be directed to an organic EL element manufacturing device having a transport chamber with a substrate transport robot arranged therein; and the organic thin film deposition device connected to the transport chamber.

An embodiment of the present invention is directed to an organic thin film deposition method, including: a first arrangement step, in which a first substrate is carried into a vacuum chamber to arrange the first substrate in a first substrate arrangement device in a horizontal posture that is horizontal, while having respective first and second organic vapor discharging planes of an organic thin film deposition device arranged in the standing manner, the organic thin film deposition device having first and second substrate arrangement devices arranged in the same vacuum chamber and capable of arranging substrates and first and second organic vapor discharging devices, provided in the vacuum chamber, with discharging openings being formed in the first and second organic vapor discharging planes; a first standing step, in which the first substrate is held by the first substrate arrangement device to be in a standing posture that is standing, and the first substrate is made to face the first organic vapor discharging plane; a first film formation starting step, in which a discharge of an organic material vapor from the discharging openings of the first organic vapor discharging device is started; a second arrangement step, in which a second substrate is carried into the vacuum chamber, while the first substrate arrangement device is in the standing posture to arrange the second substrate in the second substrate arrangement device switched into the horizontal posture; a second standing step, in which the second substrate is held by the second substrate arrangement device to switch into the standing posture, and the second substrate is made to face the second organic vapor discharging plane; a second film formation starting step, in which a discharge of an organic material vapor from the discharging openings of the second organic vapor discharging device is started; and a first carry-out step, in which the first substrate arrangement device is switched into the horizontal posture while the second substrate arrangement device is standing, and the first substrate is carried out of the vacuum chamber, wherein the first film formed substrate is carried out during film formation of the second substrate.

The present embodiment may also be directed to the organic thin film deposition method, wherein in the first and second standing steps, the standing posture is switched from the horizontal posture in a state of first and second masks respectively arranged on the first and second substrates, and wherein in the first carry-out step, the first substrate is carried out of the vacuum chamber after the masks are separated apart from the substrates.

The present embodiment may also be directed to the organic thin film deposition method, wherein in the first and second arrangement steps, the first and second masks have been respectively arranged on the first and second substrate arrangement devices in the horizontal posture in a state of being spaced apart, and the first and second substrates carried into the vacuum chamber are inserted between the first and second masks and the first and second substrate arrangement devices, and next, a position adjustment step is carried out that adjusts positions of the first and second substrates and the first and second masks.

The present embodiment may also be directed to the organic thin film deposition method, wherein the first and second organic vapor discharging planes are tilted from perpendicularity, and wherein in the first and second standing steps, the first and second organic vapor discharging devices are rotated at an angle of less than 90° from the horizontal posture to place the devices in the standing posture that is tilted at an angle the same as the first and second organic vapor discharging planes.

Effects of the Invention

With one organic thin film deposition device, two substrate sheets can be vapor deposited at the same time.

While a film is formed on one of the substrates, the alignment between the other substrate and a mask can be processed, so that the operating rate of an alignment device is improved.

DETAILED DESCRIPTION OF THE PREFERRED EMBODIMENTS

Best Mode for Carrying Out the Invention

Figure 1:
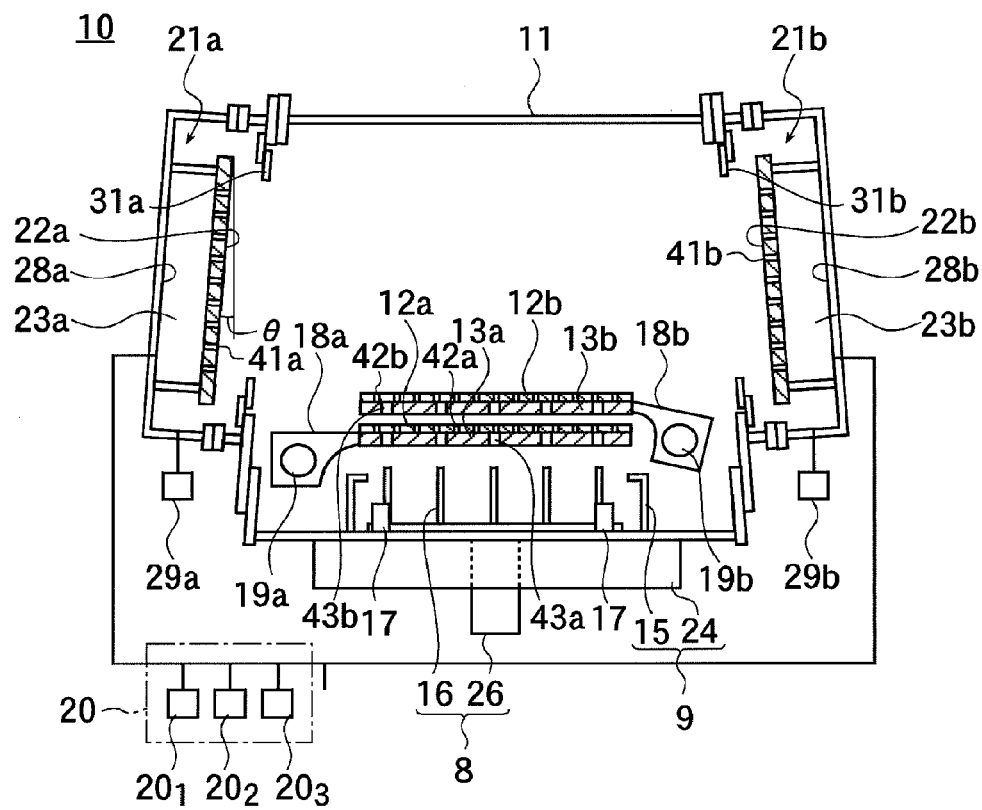
FIG. 1 is an organic thin film deposition device used in an embodiment of the present invention.

FIG. 1 illustrates an organic thin film deposition device 10, which is used in one example of the present invention.

The organic thin film deposition device 10 has a vacuum chamber 11, first and second substrate arrangement devices 13a and 13b, and first and second organic vapor discharging devices 21a and 21b.

The first and second substrate arrangement devices 13a and 13b are arranged inside the vacuum chamber 11. In addition, first and second rotating shafts 19a and 19b are horizontally arranged inside the vacuum chamber 11, and the first and second substrate arrangement devices 13a and 13b are attached to the first and second rotating shafts 19a and 19b by attachment members 18a and 18b, respectively. The first and second substrate arrangement devices 13a and 13b rotate due to the rotation of the first and second rotating shafts 19a and 19b, with their surfaces configured such that they can take either: a horizontal posture, which is horizontal; or a standing posture, which is standing at an angle of a tilt angle θ, which is described later, tilted from a perpendicular position.

The first and second organic vapor discharging devices 21a and 21b are arranged on side walls 28a and 28b, facing each other, of the vacuum chamber 11, respectively.

The first and second organic vapor discharging devices 21a and 21b have first and second organic vapor discharging planes 22a and 22b with a large number of discharging openings 41a and 41b formed therein, respectively, and the first and second organic vapor discharging planes 22a and 22b are tilted at several degrees which is a tilt angle θ (θ=2-20°); thereby arranged in a standing manner inclined at an angle of 80°-88°, facing downward.

The first and second substrate arrangement devices 13a and 13b rotate from the horizontal posture at an angle (angle less than 90°: 90°−θ) that is smaller than the angle of perpendicularity by the tilt angle θ and stop still. Taking the state of stopping or staying still at this angle as a standing posture, they respectively face the first and second organic vapor discharging devices 21a, 21b, in the standing posture.

When both of the first and second substrate arrangement devices 13a, 13b are in the horizontal posture, they can stop or stay still in different heights vertically; and at the same position horizontally. In other words, either end of the first and second substrate arrangement devices 13a and 13b stops or stays still at a position right above the other; and in this embodiment, the first substrate arrangement device 13a is at a position right below.

On the first and second substrate arrangement devices 13a and 13b, first and second masks 12a and 12b are arranged, respectively, and the first and second masks 12a and 12b are constructed from a magnetic material that is absorbed to a magnet, such as iron, nickel, or cobalt.

Figure 2:
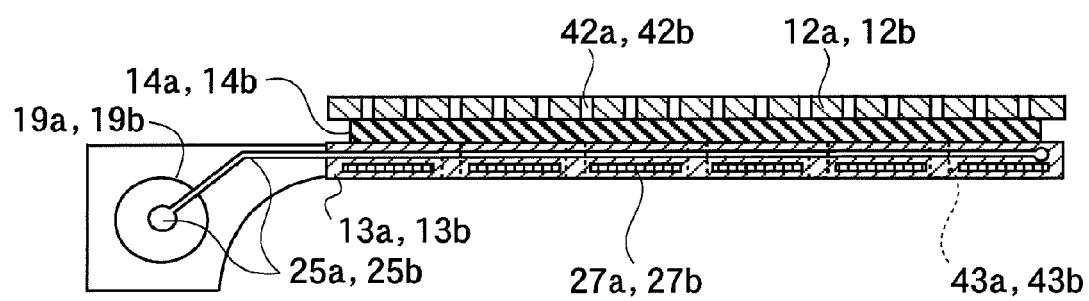
FIG. 2 is a diagram for illustrating a portion of the device for arranging a substrate thereof.

As shown in FIG. 2, the first and second substrate arrangement devices 13a, 13b are provided with magnets 27a, 27b, and the substrates 14a, 14b, which subjected to film formation, are placed on the first and second substrate arrangement devices 13a, 13b in the horizontal posture with film formation planes of the substrates facing upward; and when the first or second mask 12a, 12b is placed on the substrate 14a or 14b, the first and second masks 12a, 12b are magnetically attracted by the magnets 27a, 27b in the first and second substrate arrangement devices 13a, 13b to press the substrates 14a, 14b on the first and second substrate arrangement devices 13a, 13b.

Accordingly, the substrates 14a, 14b are sandwiched in between the first mask 12a and the first substrate arrangement device 13a, or by the second mask 12b and the second substrate arrangement device 13b, and are held by the first or second substrate arrangement device 13a, 13b. When the first and second substrate arrangement devices 13a, 13b are positioned to the standing posture from the horizontal posture, the first and second masks 12a, 12b and the substrates become the standing posture together with the first and second substrate arrangement devices 13a, 13b. In the standing posture, the first and second masks 12a, 12b, the substrates, and the first and second substrate arrangement devices 13a, 13b are tilted together by the tilt angle θ from a perpendicular position, so that the respective film formation planes face upward by the tilt angle θ to face the first and second organic vapor discharging devices 21a and 21b.

Figure 3:
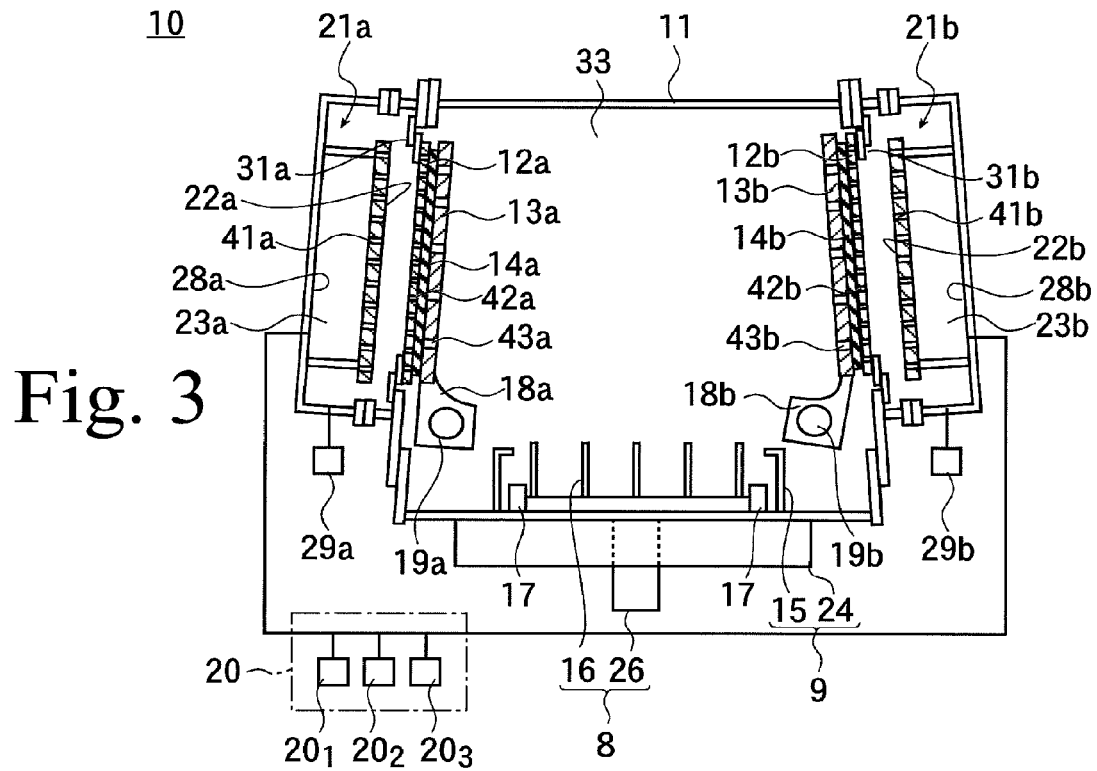
FIG. 3 is a diagram (1) for illustrating an operation of the organic thin film deposition device used in an embodiment of the present invention.

FIG. 3 shows a state of the first and second substrate arrangement devices 13a, 13b in the standing posture respectively sandwiching the substrates 14a, 14b.

The substrates 14a, 14b are glass substrates with an electrode formed on the film formation plane, and an organic thin film is formed on the surface of the film formation plane with the electrode formed thereon.

On the first and second substrate arrangement devices 13a, 13b, the substrate 14a, 14b has the film formation plane directed to the first or second mask 12a, 12b. In the first and second masks 12a, 12b, openings 42a, 42b are formed in the portions corresponding to the positions to form a thin film on the film formation planes.

Outside the vacuum chamber 11, an organic vapor generation source 20 is arranged and generates an organic material vapor, which is a vapor of an organic compound; and the first and second organic vapor discharging devices 21a, 21b are connected to the organic vapor generation source 20 to supply an organic material vapor generated in the organic vapor generation source 20.

Parallel to the first and second organic vapor discharging planes 22a, 22b of the first and second organic vapor discharging devices 21a, 21b, first and second contacting members 31a, 31b are respectively arranged.

The first and second contacting members 31a, 31b are in the shape of a ring which can come into contact with the peripheral areas of the first and second substrate arrangement devices 13a, 13b in the standing posture; and the first and second contacting members 31a, 31b are arranged at opening positions in the portions in a container shape of the vacuum chamber 11 where the first and second organic vapor discharging devices 21a, 21b are arranged.

The first and second substrate arrangement devices 13a, 13b in the standing posture respectively come into contact with the first and second contacting members 31a, 31b in their entireties or a portion of the peripheral areas thereof; and the areas in a container shape, where the first and second organic vapor discharging devices 21a, 21b are arranged, are covered by the first and second substrate arrangement devices 13a, 13b, the substrates 14a and 14b, and the first and second masks 12a and 12b to form a first deposition space 32a, between the first substrate arrangement device 13a and the first organic vapor discharging device 21a; and to form a second deposition space 32b between the second substrate arrangement device 13b and the second organic vapor discharging device 21b.

A moving space 33 which is the portion between the first and second substrate arrangement devices 13a, 13b in the standing posture in the vacuum chamber 11 is a space for movement when the first and second substrate arrangement devices 13a, 13b are moved between the horizontal posture and the standing posture; and in such a state whereby the first and second substrate arrangement devices 13a, 13b in the standing posture are respectively in contact with the first and second contacting members 31a, 31b, the first and second deposition spaces 32a and 32b are respectively separated from the moving space 33 for movement.

The first deposition space 32a and the second deposition space 32b are respectively connected to vacuum evacuation devices 29a and 29b, and are configured to be vacuum evacuated. The first and second contacting members 31a, 31b do not hermetically seal the first and second deposition spaces 32a, 32b, and the first and second deposition spaces 32a, 32b are connected to the moving space 33; and the moving space 33 is vacuum evacuated via the first and second deposition spaces 32a, 32b by the vacuum evacuation devices 29a and 29b in the state of the first and second substrate arrangement devices 13a and 13b in the standing posture.

The first and second organic vapor discharging devices 21a, 21b have main bodies in the shape of a container; and the main bodies are blocked by plate shaped members having the first and second organic vapor discharging planes 22a, 22b on one side; and cavities 23a, 23b are provided inside the first and second organic vapor discharging devices 21a, 21b. The organic material vapor supplied to the first and second organic vapor discharging devices 21a, 21b fills in the cavities 23a, 23b.

The discharging openings 41a and 41b are in communication with the cavities 23a and 23b, and the organic material vapor that fills the cavities 23a and 23b is evenly discharged from each of the discharging openings 41a and 41b into the first or second deposition space 32a, 32b in a state of vacuum and passes through the openings 42a and 42b of the first and second masks 12a and 12b to reach the film formation planes of the substrates 14a and 14b; and an organic thin film in the shape of a flat plane in accordance with the shape of a flat plane of the openings 42a and 42b is formed on the film formation planes. The organic material vapor may also be discharged by arranging the organic vapor generation source 20 in the cavities 23a and 23b, or the vapor may also be discharged directly, by arranging an organic compound in the cavities 23a and 23b.

With FIG. 3 illustrating a state in which the organic material vapor is discharged from the first and second organic vapor discharging devices 21a, 21b and a thin film is grown on the surfaces of the substrates 14a and 14b held by the first and second substrate arrangement devices 13a, 13b, either one of the first and second substrate arrangement devices 13a, 13b has an earlier film formation starting time than the other, so that the supply of the organic material vapor from the organic vapor generation source 20 toward the first or second organic vapor discharging device 21a, 21b of the either substrate 14a or 14b, which has finished with film formation and held by the first or second substrate arrangement devices 13a, 13b in the standing posture during film formation, is stopped.

Figure 4:
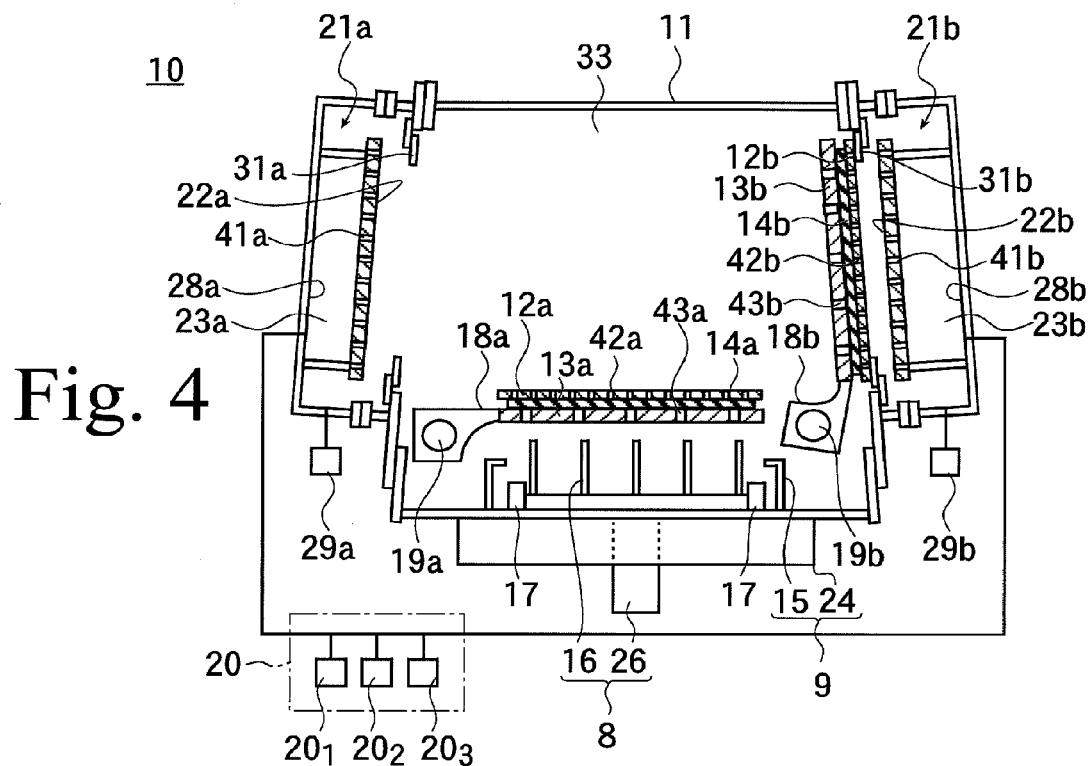
FIG. 4 is a diagram (2) for illustrating an operation of the organic thin film deposition device used in an embodiment of the present invention.

In this embodiment, suppose that the organic thin film formation of the substrate 14a held by the first substrate arrangement device 13a is finished, after the supply of the organic material vapor to the first organic vapor discharging device 21a is stopped, as shown in FIG. 4, the first substrate arrangement device 13a is rotationally moved from the standing posture to the horizontal posture. At this time, the substrate 14b held by the second substrate arrangement device 13b forms an organic thin film and the second substrate arrangement device 13b is maintained in the standing posture.

When either of the first or second substrate arrangement devices 13a, 13b is made into the horizontal posture, a mask moving device 9 and a substrate moving device 8 are arranged at a position below the first or second substrate arrangement device 13a, 13b made in the horizontal posture.

The mask moving device 9 has alignment pins 15 that are made perpendicular and an alignment mechanism 24 that moves the alignment pins 15 vertically and horizontally.

A portion or all of the peripheries of the first and second masks 12a, 12b protrudes out of the edges of the substrates 14a and 14b.

When, one of the first and second substrate arrangement devices 13a, 13b is in the horizontal posture and the other is in the standing posture, as the alignment pins 15 are lifted by the alignment mechanism 24, the alignment pins 15 pass outside of the outer circumference of the substrate 14a or 14b, on the first or second substrate arrangement device 13a, 13b in the horizontal posture and an upper end of the alignment pins 15 come into contact with the portion where the first or second mask 12a, 12b protrudes out of the substrate 14a or 14b.

In this embodiment, each tip of the alignment pins 15 is provided with a hook and the hook comes into contact with the first or second mask 12a, 12b.

The alignment pins 15 are aligned in two rows along the side walls 28a and 28b on which the first and second organic vapor discharging devices 21a and 21b are arranged; and when the alignment mechanism 24 is lifted, they are designed to come into contact with a position which is close to two parallel sides of the rear faces of the first and second masks 12a and 12b in the shape of a quadrangle.

After coming into contact, as the alignment pins 15 are lifted even more with a force greater than a magnetic absorbing force between the first and second masks 12a, 12b and the magnets 27a and 27b in the first and second substrate arrangement devices 13a, 13b, a pressing force by the magnetic absorbing force of the masks toward the first or second substrate arrangement device 13a, 13b is removed and the first or second mask 12a, 12b is lifted up by the alignment pins 15.

The substrate moving device 8 has a substrate transfer mechanism 26 and transfer pins 16. The first and second substrate arrangement devices 13a, 13b are respectively provided with through holes 43a and 43b; and after lifting up the first or second mask 12a, 12b in the horizontal posture, when the substrate transfer mechanism 26 lifts the transfer pins 16 to insert the transfer pins 16 into the through holes 43a, 43b of the first or second substrate arrangement device 13a, 13b in the horizontal state, upper ends of the transfer pins 16 come into contact with the rear face portions of the substrates located on the through hole 43a, 43b. As the transfer pins 16 are lifted further, the substrate is lifted up by the upper ends of the transfer pins 16, and the substrates 14a, 14b are transferred from the first or second substrate arrangement device 13a, 13b onto the transfer pins 16.

In such a manner, when one of the first and second substrate arrangement devices 13a, 13b holding the substrates 14a and 14b is in the horizontal posture and the other is in the standing posture, the first or second mask 12a, 12b and the substrates 14a, 14b on the first or second substrate arrangement device 13a, 13b in the horizontal posture can respectively be lifted up.

Figure 5:
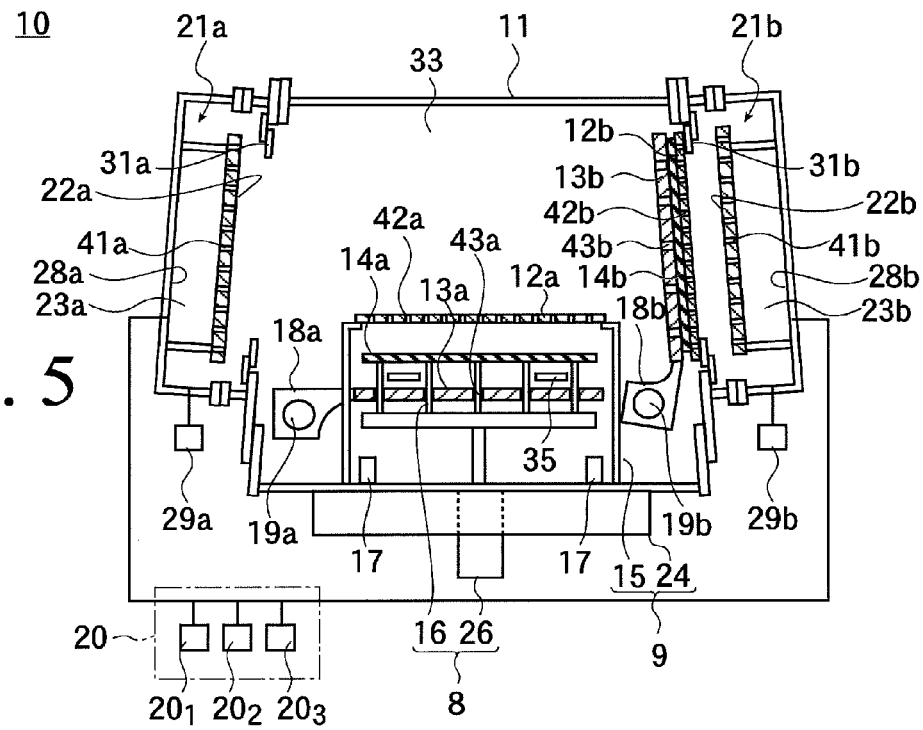
FIG. 5 is a diagram (3) for illustrating an operation of the organic thin film deposition device used in an embodiment of the present invention.

In this embodiment, since the first substrate arrangement device 13a is in the horizontal posture and the second substrate arrangement device 13b is in the standing posture, the first mask 12a and the substrate 14a on the first substrate arrangement device 13a are lifted up as shown in FIG. 5. At this time, the substrate 14b on the second substrate arrangement device 13b in the standing posture may be finished with film formation or may also be in the middle of film formation.

Figure 10:
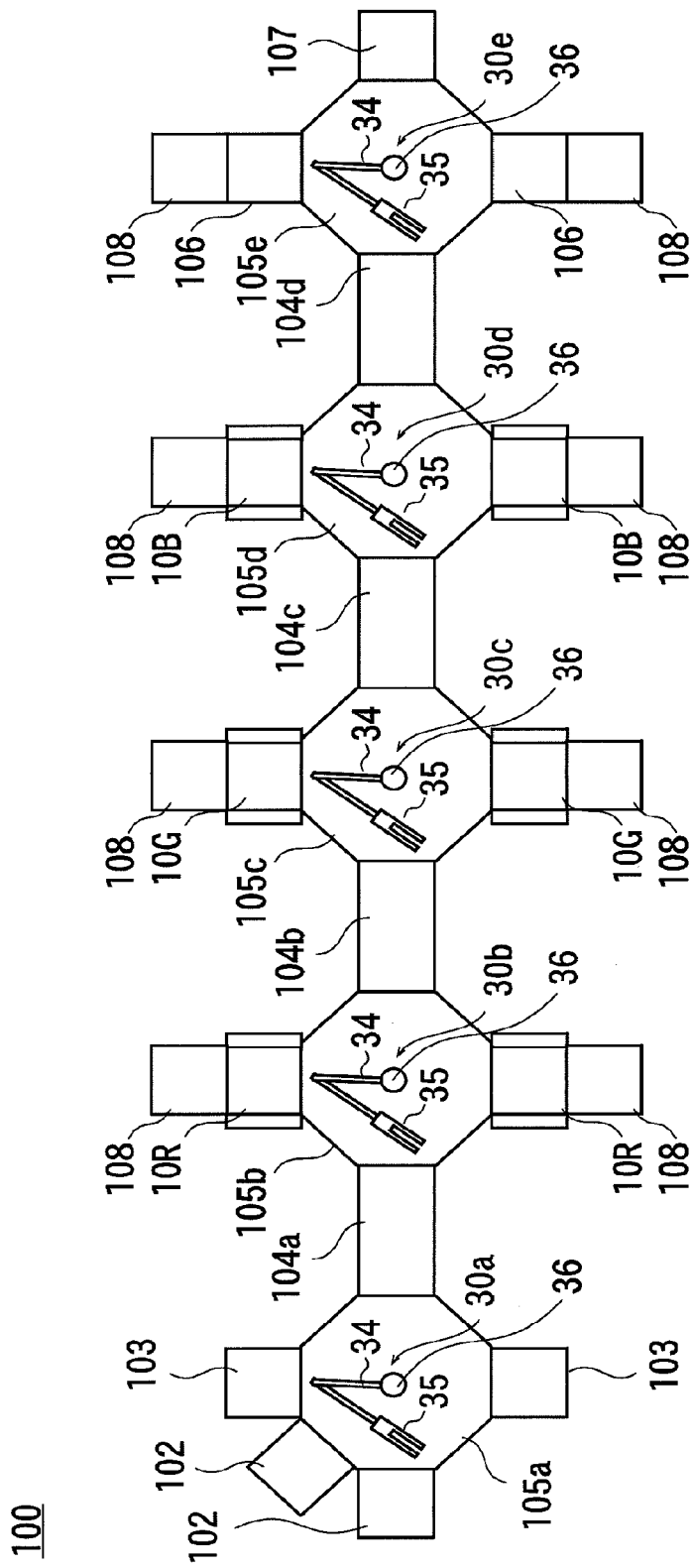
FIG. 10 is one example of an organic EL element manufacturing device used in one embodiment of the present invention.
Figure 11A:
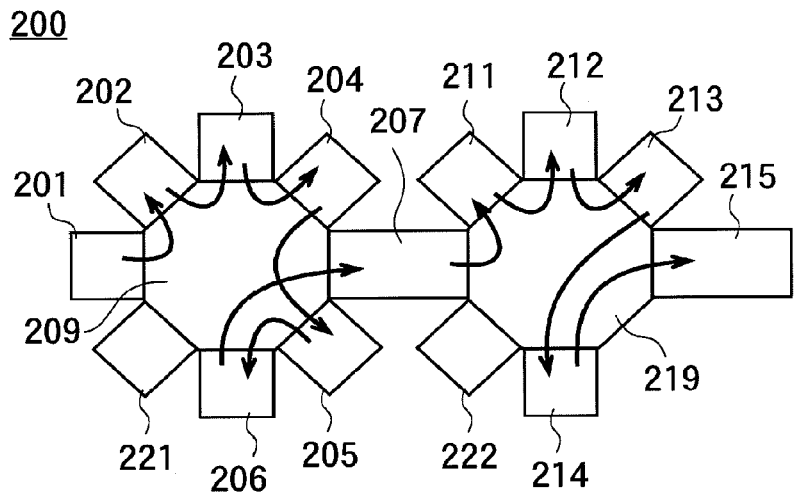
FIG. 11(a) is an organic EL element manufacturing device of a cluster system of the prior art
Figure 11B:
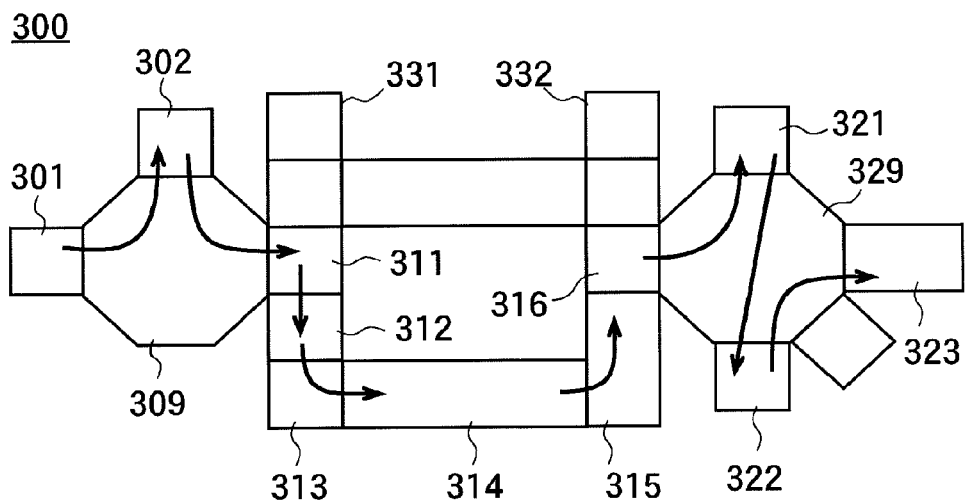
FIG. 11(b) is an organic EL element manufacturing device of an in-line system.

To one wall of the vacuum chamber 11 of the organic thin film deposition device 10, transport chambers 105b through 105d are connected as shown in FIG. 10 as described later; and substrate transport robots 30b through 30d are arranged inside the transport chambers 105b through 105d.

The transport chambers 105b through 105d are not connected to the side walls 28a and 28b on which the first and second organic vapor discharging devices 21a and 21b are arranged, and are connected to the other side walls.

The substrate transport robots 30b through 30d have an arm 34 connected to a rotating shaft 36 and a hand 35 provided at the tip of the arm 34, and are configured to be able to place the substrates 14a, 14b on the hand 35.

On a side of the side walls on which the vacuum chamber 11 is connected to the transport chambers 105b through 105d, the alignment pins 15 are not provided; and the width of the hand 35 is formed to be smaller than a distance between the alignment pin 15 on one side wall and the alignment pin 15 on the other side wall.

In addition, the hand 35 is formed in such a shape as to be able to be inserted between the transfer pins 16 that lift the substrates 14a, 14b up; therefore, as the first or second mask 12a, 12b is lifted up by the alignment pins 15, and as the substrate 14a or 14b is lifted up by the transfer pins 16, the hand 35 is inserted between the alignment pins 15 in two rows and between the transfer pins 16 to make it still between the first or second substrate arrangement device 13a, 13b and the substrate 14a or 14b.

Figure 6:
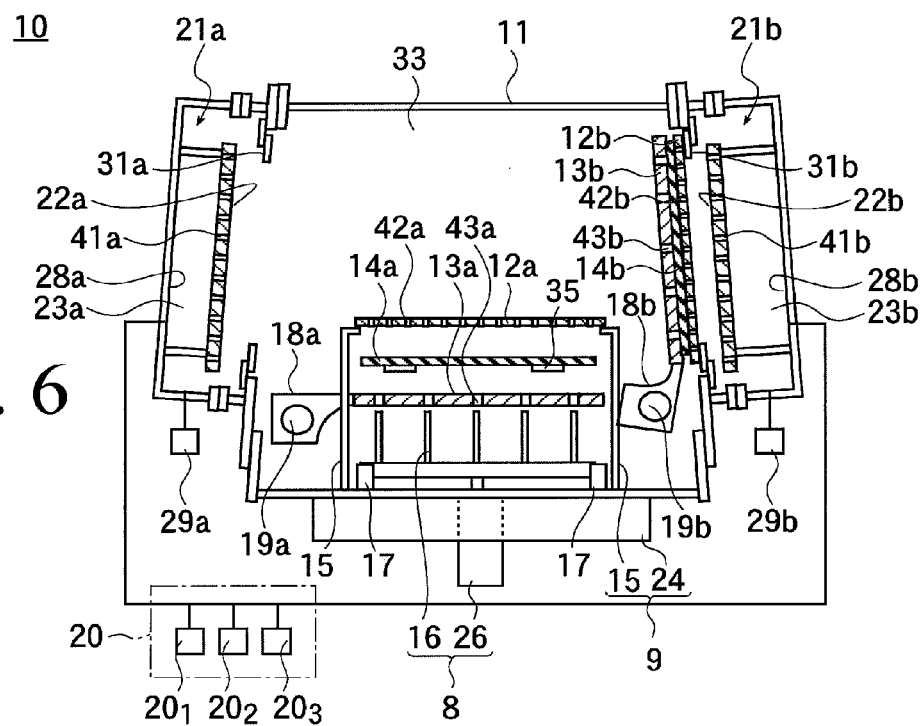
FIG. 6 is a diagram (4) for illustrating an operation of the organic thin film deposition device used in an embodiment of the present invention.

FIG. 5 illustrates a state in which the hand 35 is inserted into a position right below the substrate 14a and is stopped or made to stay still between the first substrate arrangement device 13a and the substrate 14a. As the transfer pins 16 are lowered in such a state, the substrate 14a is also lowered together, and as shown in FIG. 6, the substrate 14a on the transfer pins 16 is transferred onto the hand 35.

Next, the arms 34 of the substrate transport robots 30b through 30d are shortened to return the hand 35, on which the substrate 14a is placed, into the transport chambers 105b through 105d; then, the arm 34 is rotated and extended to carry the substrate 14a together with the hand 35 into a vacuum chamber of another device; and as the substrate 14a is arranged in the vacuum chamber, the hand 35 becomes vacant to be able to place another substrate on the hand 35.

The transfer pins 16 are maintained in the lowered state, and the substrate, arranged in a carry-in/out chamber (i.e., the chambers denoted by the reference numeral 102 in FIG. 10 as described later) or delivery chambers 104a through 104d, is placed on the hand 35 and the hand 35 in this state is inserted between the first or second masks 12a, 12b on the alignment pins 15 and the first or second substrate arrangement devices 13a, 13b in the horizontal posture to be stopped or made to stay still.

Thereafter, as the transfer pins 16 are lifted, the substrate on the hand 35 is transferred onto the tip ends of the transfer pins 16.

Figure 7:
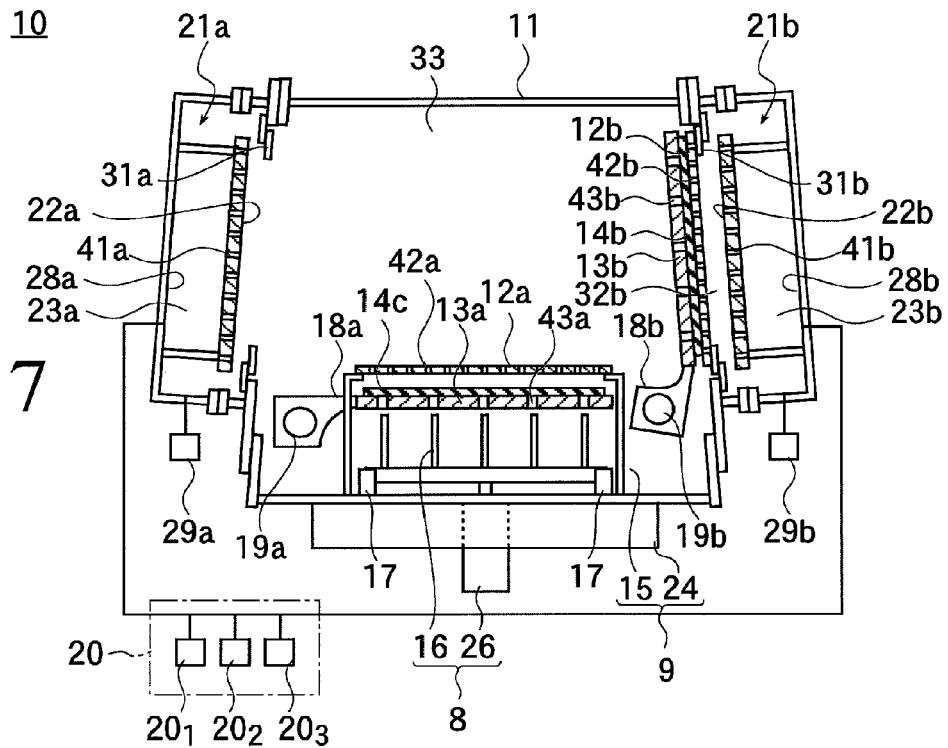
FIG. 7 is a diagram (5) for illustrating an operation of the organic thin film deposition device used in an embodiment of the present invention.

Then, after extracting the hand 35 from between the alignment pins 15 and between the transfer pins 16 to evacuate it, as the transfer pins 16 are lowered down to a position below the surfaces of the first and second substrate arrangement devices 13a, 13b, the substrate is transferred from the transfer pins 16 onto the first or second substrate arrangement device 13a, 13b in the horizontal posture. In this embodiment, the second substrate arrangement device 13b is in the standing posture; and as shown in FIG. 7, the substrate is placed on the first substrate arrangement device 13a in the horizontal posture. A reference numeral 14c in FIG. 7 denotes the substrate as placed.

A camera 17 is arranged at a position below the first and second substrate arrangement devices 13a, 13b in the horizontal posture. The first and second masks 12a, 12b and the substrates 14a through 14c are respectively provided with alignment marks, and the alignment marks of the substrates 14a-14c can be observed by the camera 17, and the alignment marks of the first and second mask 12a, 12b can be observed via the substrates 14a-14d which are transparent.

The camera 17 is connected to a control device; and while the control device observes the alignment marks of the substrate and the alignment marks of the first or second mask 12a, 12b in the horizontal posture located on the alignment pins 15 by means of the camera 17, it moves the alignment pins 15 horizontally with the mask moving device 9 to horizontally move the first or second mask 12a, 12b on the alignment pins 15 for position adjustment (alignment) of the substrates 14a-14c and the first or second mask 12a, 12b.

Next, as the alignment pins 15 are lowered perpendicularly, the first or second mask 12a, 12b is magnetically absorbed to the magnet 27a or 27b in the first or second substrate arrangement device 13a, 13b, in a state of being in close contact or adjacent to the substrate. As the first or second mask 12a, 12b is magnetically absorbed, the substrates 14a-14c and the first or second mask 12a, 12b are fixed in a state of being aligned on the first or second substrate arrangement device 13a, 13b.

The first mask 12a and the substrate 14c are position adjusted to fix the first mask 12a on the first substrate arrangement device 13a together with the substrate 14c by magnetic absorbing; and the first mask 12a and the substrate are made to be in the standing posture in a state of being held by the first substrate arrangement device 13a, and film formation to the substrate 14c is started.

Figure 8:
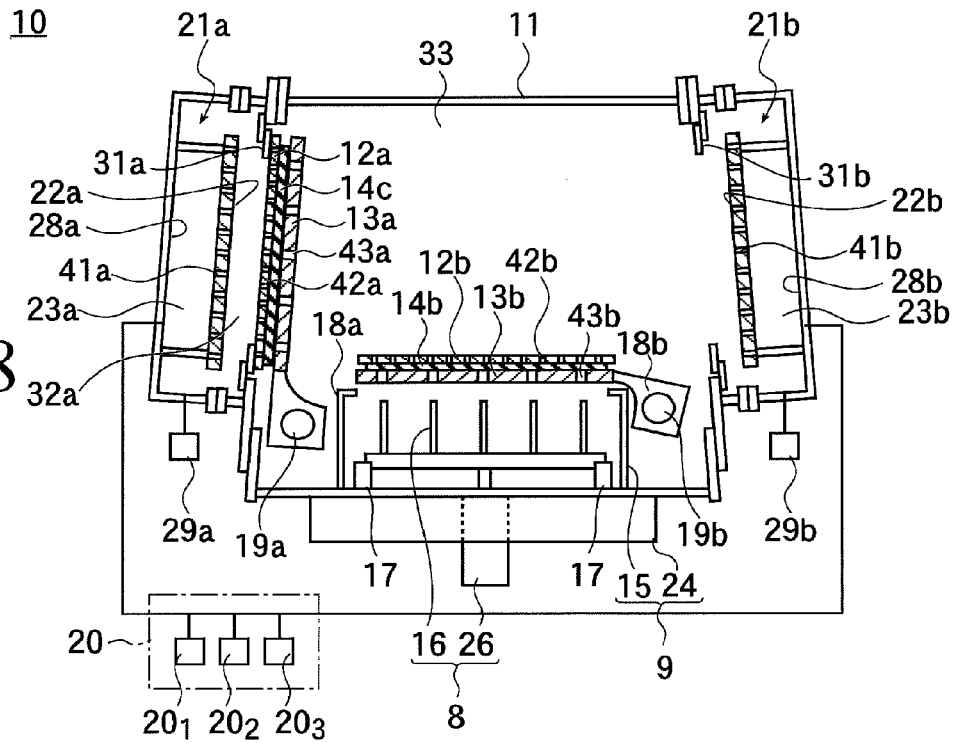
FIG. 8 is a diagram (6) for illustrating an operation of the organic thin film deposition device used in an embodiment of the present invention.

When thin film formation to the substrate 14b held by the second substrate arrangement device 13b is finished during the thin film formation to the substrate 14c held by the first substrate arrangement device 13a, the second substrate arrangement device 13b and the substrate 14b and the second mask 12b held by the second substrate arrangement device 13b are, as shown in FIG. 8, switched from the standing posture to the horizontal posture, as in the replacement of the substrates 14a and 14c on the first substrate arrangement device, the substrate 14b finished with thin film formation on the second substrate arrangement device 13b is also replaced with a substrate that is not yet film formed, followed by switching to the standing posture to carry on the film formation operation.

Reference numerals 25a and 25b in FIG. 2 are medium passages for a cooling medium provided in the first and second substrate arrangement devices 13a and 13b, and a cooling medium that is cooled is also made to travel to the medium passages 25a, 25b in the first and second substrate arrangement devices 13a, 13b in the standing posture to decrease the temperature of the substrates 14a-14c during the film formation in order to prevent the organic thin film to be formed from being thermally damaged, which can also make the heat stretch of the first and second masks 12a and 12b is smaller.

The organic vapor generation source 20 of the present invention has a plurality of containers $20_1$-$20_3$, so that different types of organic materials are respectively arranged in the different containers $20_1$-$20_3$ to make it possible to generate vapor individually. For example, a hole injecting organic substance, a hole transporting organic substance, a light emitting organic substance of R (red), G (green), or B (blue), and an electron transporting organic substance can be arranged in the separated containers $20_1$-$20_3$ for the generation of a vapor.

When the first and second substrate arrangement devices 13a, 13b are switched to the standing posture to discharge vapors of each organic substance in the order from the first and second organic vapor discharging devices 21a, 21b, an organic EL layer in which a thin film of each organic substance is laminated in a different position with respect to R, G, and B can be obtained on the surfaces of the substrates 14a-14c.

Figure 9A:
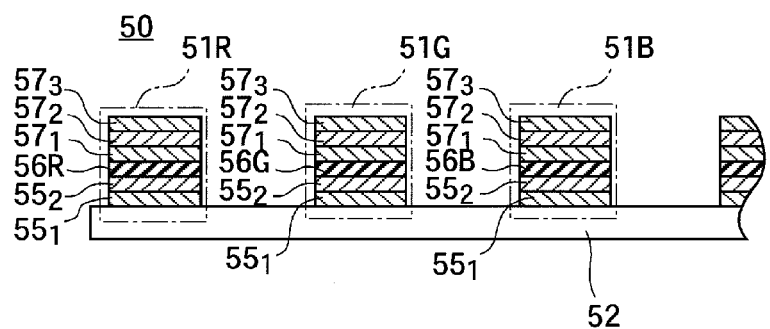
FIG. 9(a) is a diagram for illustrating an organic EL element of color light emission.

In FIG. 9(a), an organic EL element 50 with organic EL layers 51R, 51G, and 51B, formed in different positions, respectively made with a lamination layer of, in the order from the glass substrate 52 side, a hole injection layer $55_1$, a hole transport layer $55_2$, light emission layers 56R, 56G, and 56B of R, G, or B, an electron transport layer $57_1$, an electron injection layer $57_2$, and a cathode electrode layer $57_3$ (an anode electrode is omitted), is illustrated.

A reference numeral 100 in FIG. 10 generally illustrate an organic EL element manufacturing device for forming the organic EL element 50, and the plurality of transport chambers 105a-105d connected by the delivery chambers 104a-104d. A carry-in chamber 102 and a pre-process chamber 103 are connected to the transport chamber 105a in the first stage, and a plurality (in this embodiment, two) of organic thin film deposition devices 10R, 10G, and 10B, in which hole injecting organic substance, hole transporting organic substance, light emitting organic substance of R (red), G (green), or B (blue), and electron transporting organic substance are arranged, are connected to the transport chambers 105b through 105d in the middle stages.

One, or a plurality of sputtering chambers (in this embodiment, two) 106 and a carry-out chamber 107 are connected to a transport chamber 105e in the last stage.

Substrate transport robots 30a through 30e are arranged in each of the transport chambers 105a-105e, and the hand 35 at the tip of the arm 34 are designed such that it can be inserted into and extracted from each chamber connected to the transport chambers 105a through 105e.

A stock chamber 108, in which masks to be replaced in each of the organic thin film deposition devices 10R, 10G, and 10B and in the sputter device 106 are stocked, is connected to organic thin film deposition devices 10R, 10G, and 10B and the sputter device 106.

Figure 9B:
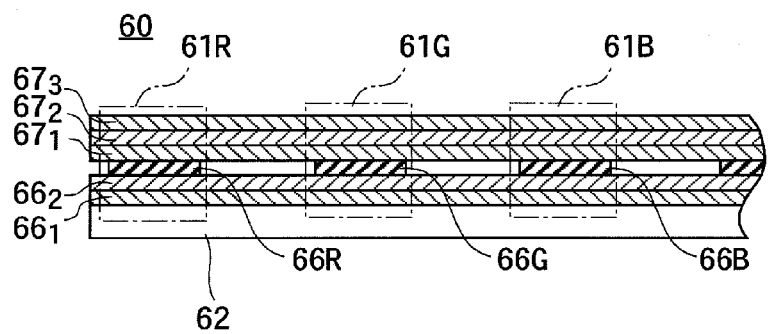
FIG. 9(b) is a diagram for illustrating an organic EL element of white light emission.

FIG. 9(b) shows an organic EL element 60, after forming a hole injection layer $66_1$ and a hole transport layer $66_2$ on a glass substrate 62 by an organic thin film deposition device related to holes, when respective light emission layers 66R, 66G, and 66B in different positions are formed by a red organic deposition device, a green organic deposition device, and a blue organic deposition device in which different masks are arranged; then, an electron transport layer $67_1$ and an electron injection $67_2$ are formed by an organic thin film deposition device related to electrons, and a cathode electrode $67_3$ is formed by a sputter device. In the organic EL element 60, white light can be emitted by flowing current in each of the light emission layers 66R, 66G, and 66B together.

Although in the above organic EL manufacturing device 100 shown in FIG. 10, an organic material is arranged such that, inside one of the organic thin film deposition devices 10R, 10G, or 10B, an organic light emission layer in one color is formed, an organic EL element in white may also be formed by arranging organic materials in a plurality of colors in one organic thin film deposition device 10 and making an organic material vapor discharged per each color to laminate each color layer.

Although, in the above-discussed embodiment, the first and second organic vapor discharging planes 22a, 22b and the first and second substrate arrangement devices 13a, 13b are provided to stand inclined at an angle of at least 80° and at most 88° relative to the horizontal plane is shown as an example, it is also possible to provide them inclined at an angle at least 70° and at most 90° relative to the horizontal plane.

It should be noted that, by providing in a standing manner inclined at the angle less than 90°, deflection of the first and second masks 12a, 12b can be prevented; and by providing in a standing manner inclined at an angle of greater than 70°, any dropping of dust on the surfaces of the substrates 14a-14c, during film formation or before and after film formation, can be prevented.

Further, although in the above-discussed embodiment, the first and second substrate arrangement devices 13a, 13b stop or stay still with differences in heights when being switched to be in the horizontal posture as an example, the first and second substrate arrangement devices 13a, 13b may also be placed in the horizontal posture at a same position horizontally and vertically, as long as both of the first and second substrate arrangement devices 13a, 13b are controlled so as not to create a state of the first and second substrate arrangement devices 13a, 13b being in the horizontal posture at the same time, when behaviors of the first and second substrate arrangement devices 13a, 13b are controlled by the control device.

Although position adjustment between the first or second mask 12a,12b with the substrate 14a or 14b is carried out in the vacuum chamber 11 in which the first and second substrate arrangement devices 13a, 13b are arranged in the above-discussed embodiment, it is possible to connect a position adjustment chamber to the vacuum chamber 11 and carry out position adjustment between the first or second mask 12a, 12b and the substrate 14a or 14b in the position adjustment chamber; and with the position adjusted state maintained, the first or second mask 12a,12b and the substrate 14a or 14b are carried into the vacuum chamber 11 and are arranged on the first or second substrate arrangement device 13a, 13b to switch them into the standing posture for film formation.

After film formation in the standing posture, the first or second mask 12a, 12b and the substrate 14a or 14b are switched into the horizontal posture to be carried together outside the vacuum chamber 11.

What is claimed is:

1. An organic thin film deposition method using an organic thin film forming device which has a vacuum chamber, a first and second substrate arrangement devices, which are capable of arranging substrates that are arranged in the same vacuum chamber, and a first and a second organic vapor discharging devices are provided in the vacuum chamber, wherein discharging openings are formed on a first and a second organic vapor discharging planes of the first and the second organic vapor discharging devices, and the first and the second organic vapor discharging planes are arranged in a standing manner, respectively, the organic thin film deposition method, comprising:

a first arrangement step, in which the first substrate arrangement device is set in a horizontal posture that is horizontal, a first mask is arranged on the first substrate arrangement device, a first substrate is carried into a vacuum chamber, and after the first substrate is inserted between the first substrate arrangement device and the first mask, the first substrate is arranged on the first substrate arrangement device;

a first position adjustment step, in which a first mask alignment mark of the first mask and a first substrate alignment mark of the first substrate are observed by a camera, and the first mask and the first substrate are adjusted, the first substrate is sandwiched between the first substrate arrangement device and the first mask;

a first standing step, in which the first substrate and the first mask are held by the first substrate arrangement device, the first arrangement device, the first substrate and the first mask are made to be in a standing posture that is standing, and the first mask is made to face the first organic vapor discharging plane;

a first film formation starting step, in which a discharge of an organic material vapor from the discharging openings of the first organic vapor discharging device is started;

a second arrangement step, in which the second substrate arrangement device is set in the horizontal posture in a position at a horizontal direction same as the position at the horizontal direction where the first arrangement device was set in the horizontal posture, a second mask is arranged on the second substrate arrangement device, a second substrate is carried into the vacuum chamber, while the first substrate arrangement device is in the standing posture, after the second substrate is inserted between the second substrate arrangement device and the second mask, the second substrate is arranged in the second substrate arrangement device which is set to the horizontal posture;

a second position adjustment step, in which while the first substrate arrangement device is in the standing posture, a second mask alignment mark of the second mask and a second substrate alignment mark of the second substrate are observed by the camera, and the second mask and the second substrate are adjusted, and the second substrate is sandwiched between the second substrate arrangement device and the second mask;

a second standing step, in which the second mask and the second substrate are held by the second substrate arrangement device, the second arrangement device, the second substrate and the second mask are made to be in the standing posture, and the second mask is made to face the second organic vapor discharging plane;

a second film formation starting step, in which discharge of an organic material vapor from the discharging openings of the second organic vapor discharging device is started; and a first carry-out step, in which the first substrate arrangement device is set in the horizontal posture while the second substrate arrangement device is set in the standing posture, and the first substrate on which a film had been formed is carried out of the vacuum chamber during a film formation of the second substrate, wherein the first film formed substrate is carried out during film formation of the second substrate.

2. The organic thin film deposition method according to claim 1, wherein the first and second organic vapor discharging planes are tilted from perpendicularity, and wherein in the first and second standing steps, when the first and second substrate arrangement devices are set in the standing posture, the first and second substrate arrangement devices are made to be the standing position having same angle of the first and second organic vapor discharging planes by tilting the first and second substrate arrangement devices at an angle of less than 90° from the horizontal posture.

* * * * *